US006738265B1

(12) United States Patent
Svarfvar et al.

(10) Patent No.: US 6,738,265 B1
(45) Date of Patent: May 18, 2004

(54) EMI SHIELDING FOR PORTABLE ELECTRONIC DEVICES

(75) Inventors: Bror Svarfvar, Kaarina (FI); Terho Kaikuranta, Piispanristi (FI); Pertti Nousiainen, Tampere (FI); Ilpo Pyykkö, Tampere (FI); Pentti Järvelä, Tampere (FI); Marja Rissanen, Tampere (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/552,221

(22) Filed: Apr. 19, 2000

(51) Int. Cl.[7] .................................................. H05K 9/00
(52) U.S. Cl. .................... 361/818; 361/814; 361/816; 174/35 R
(58) Field of Search ....................... 361/752–753, 361/800, 814, 816–818; 174/51, 52.1–52.2, 35 R, 35 MS, 35 GC; 438/57, 106; 428/253–255; 156/242–245; 455/90; 442/117–118

(56) References Cited

U.S. PATENT DOCUMENTS

| | | | | |
|---|---|---|---|---|
| 3,580,981 A | * | 5/1971 | Lamp et al. ................... 174/35 |
| 4,197,568 A | * | 4/1980 | Inowa et al. ................. 361/230 |
| 4,388,364 A | * | 6/1983 | Sanders ....................... 428/253 |
| 4,472,086 A | * | 9/1984 | Leach .......................... 405/258 |
| 4,504,346 A | * | 3/1985 | Newsam ..................... 156/242 |
| 4,662,967 A | * | 5/1987 | Bogan et al. ................ 156/242 |
| 4,785,136 A | * | 11/1988 | Mollet et al. ............... 174/35 R |
| 4,863,789 A | | 9/1989 | Arai |
| 5,091,247 A | * | 2/1992 | Willibey et al. ............. 428/255 |
| 5,100,713 A | * | 3/1992 | Homma et al. .............. 428/102 |
| 5,191,777 A | * | 3/1993 | Schnegg ........................ 66/195 |
| 5,313,371 A | * | 5/1994 | Knecht et al. ............... 361/818 |
| 5,795,835 A | * | 8/1998 | Bruner et al. ................ 442/310 |
| 5,965,467 A | * | 10/1999 | Stevenson et al. ........... 442/218 |
| 6,031,732 A | * | 2/2000 | Koike et al. ................. 361/816 |
| 6,090,728 A | * | 7/2000 | Yenni, Jr. et al. ............ 442/117 |
| 6,150,754 A | * | 11/2000 | Yoshikawa et al. ......... 313/313 |
| 6,398,899 B1 | * | 6/2002 | Umezawa et al. ........... 156/245 |
| 6,399,879 B1 | * | 6/2002 | Ueda et al. ............. 174/35 MS |

FOREIGN PATENT DOCUMENTS

| | | |
|---|---|---|
| EP | 0742683 | 11/1996 |
| JP | 11354981 | 12/1999 |
| WO | 9957952 | 11/1999 |

* cited by examiner

*Primary Examiner*—Evan Pert
*Assistant Examiner*—Tuan Dinh
(74) *Attorney, Agent, or Firm*—Ware, Fressola, Van Der Sluys & Adolphson LLP

(57) ABSTRACT

A fiber mesh net is insert molded into an interior cavity of a cover structure of a portable electronic device such as a cellular or radio telephone to provide EMI shielding. The fiber mesh net is also bonded to one surface of a polymer sheet which additionally carries electronic circuitry on its opposite side to form a laminate which is inserted molded into a cover structure to extend electrical circuitry functionality via selected fibers of the fiber mesh net for access from the electronic device cover.

27 Claims, 6 Drawing Sheets

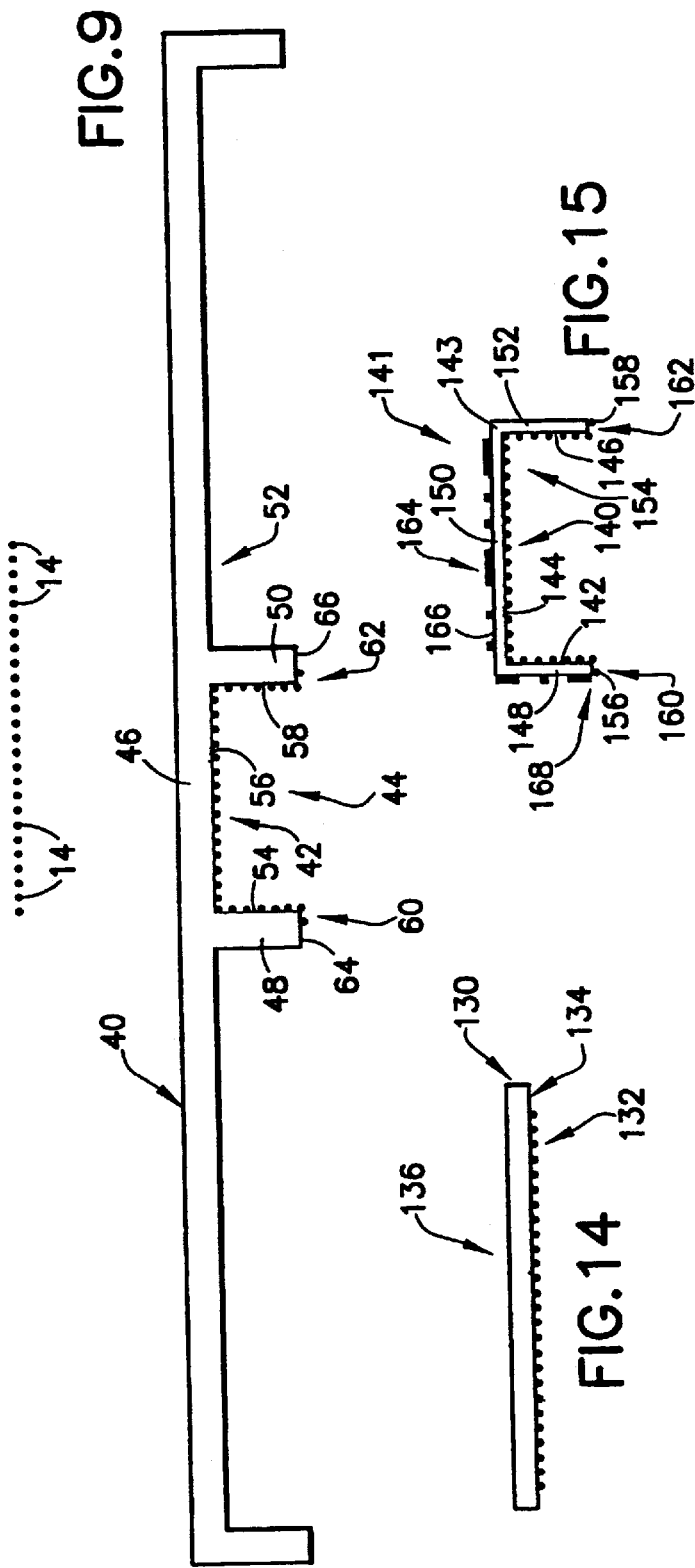

EMI SHIELDING FOR PORTABLE ELECTRONIC DEVICES

TECHNICAL FIELD OF INVENTION

The present invention relates broadly to electromagnetic interference (EMI) shielding and more specifically, but not exclusively, relates to EMI shielding for portable electronic devices such as cellular or radio telephones.

BACKGROUND OF THE INVENTION

The normal operation of electronic equipment such as computers, communications equipment, portable electronic devices such as cellular or radio telephones, and the like is attended by the generation of electromagnetic signals within the electronic circuitry of the equipment. Such electromagnetic signals often develop as a field or as a transient within the radio frequency band of the electromagnetic spectrum, i.e., from between about 10 KHz and 10 GHz, and is termed electromagnetic interference or EMI as being known to interfere with the proper operation of the electronic circuitry of other proximate electronic devices. Cellular or radio telephones in particular are required by law to adhere to Electromagnetic Compatibility (EMC) limits as laid down in Type Approval Specifications for Mobile Phones. "EMC" is defined as the ability of a device to function properly in its intended electromagnetic environment and not to be a source of electromagnetic pollution to that environment.

To reduce or attenuate the effects of EMI, shielding having the capability of absorbing and/or reflecting EMI energy may be employed both to confine the EMI energy within a source device, and to insulate the device or other target devices from other source devices. Such shielding is provided as a barrier which is inserted between the source and the other devices, and is typically configured as an electrically conductive and grounded housing which encloses the device. As the device generally must remain accessible for servicing or the like, most housings are provided with openable or removable accesses such as doors, hatches, panels, or covers. Typically, there are gaps between the accesses and the corresponding mating surfaces which reduce the efficiency of the shielding by presenting openings through which electromagnetic energy may leak or otherwise pass into or out of the device. Furthermore, such gaps represent discontinuities in the surface and ground conductivity of the housing or other shielding, and may even generate a secondary source of EMI radiation by functioning as a form of slot antenna. Any bulk or surface currents induced within the device housing develop voltage gradients across any interface gaps in the shielding thereby causing the gaps to function as antennae which radiate EMI noise.

One preferred shielding solution is to use a cover or housing shell made of metal to absorb and shield any EMI radiation energy generated by the electronic device. One drawback of such metal covers is additional weight and cost which is added to the electronic device. A further drawback is the inability and difficulty to form the metal sheet to a desired shape and contour of the electronic device housing thereby requiring the electronic device to be larger and less aesthetically pleasing than would otherwise be possible if not for the metal enclosure required for the EMI shielding. One proposed solution to reduce the weight and accommodate the shape and contour of the electronic device is to spray a metallized surface coating on the interior of a lightweight plastic or other suitable lightweight material forming the electronic device housing. Although this has the advantage of reducing the weight, the cost is increased due to the additional step of applying the metallized coating which complicates the manufacturing process and the cost of the metallic coating itself. Additionally, the metallized coating is easily scratched which reduces its shielding effectiveness.

A further problem is that the mating surface of the electronic device housing covers regardless of the material is not perfectly flat so that mating interfaces provide gaps from which EMI radiation energy can escape. Gaskets and other seals have been proposed for filling the gaps within mating surfaces of housings and other EMI shielding structures while maintaining electrical continuity across the structure. Such gaskets or seals are bonded or mechanically attached to or pressfitted into one of the mating surfaces and function to close any interface gap to establish a continuous conductive path thereacross by conforming under an applied pressure to irregularities between the surfaces. However, even pressure on the gasket interfaces may also generate gaps between the gasket surface and the ground layer and function as slot antenna to radiate EMI noise. In addition, the gaskets are also subject to shielding failures due to problems with compressibility, resiliency, and attachment. Further, there is an increasing demand in new products to make them smaller by reducing the number of screws, fastening devices and contact points which will require a more efficient and cost effective method for EMI shielding to accommodate these demands.

DISCLOSURE OF THE INVENTION

Accordingly it is an object of the present invention to provide an efficient and cost effective EMI shielding solution for portable electronic products particularly cellular and radio telephones.

In one aspect of the invention, an EMI shielding solution for a portable electronic device includes an electrically conductive fiber mesh net insert molded into the walls defining an interior cavity of the device to surround and shield first electronic circuitry contained within the device.

In a further aspect of the invention, at least a portion of the fiber mesh net is brought into direct continuous physical and electrical contact with a ground plane carried on a circuit board substrate within the electronic device.

In another aspect of the invention, an EMI shielding solution for a portable electronic device includes an electrically conductive fiber mesh net laminated to a surface of a polymer film sheet.

In a further aspect of the invention, the polymer film sheet has an electrically non-conductive surface opposite the fiber mesh net surface for carrying second electronic circuitry, and at least a portion of the fiber mesh net extends to the non-conductive side for mechanical and electrical coupling to the second electronic circuitry.

In a yet further aspect of the invention, the fiber mesh net is a mixture of conductive and non-conductive fibers with at least one of the conductive fibers carrying electrical signals from the first electronic circuitry on the printed circuit board to the second electronic circuitry.

In a yet further aspect of the invention, the fiber mesh consists of natural fibers or filaments such as cotton and other cellulose fibers, silk or other protein fibers and/or glass or other ceramic fibers.

In a yet further aspect of the invention, the fiber mesh consists of man-made synthetic, regenerated or metal fiber and filaments, such as polyesters, polyamides, polypropylenes, polyethylenes and cellulosics, and particularly suited are PES, PA6.6, PA6, PP and copper. Fibers, filaments, and yarns can be coated by a thin layer of a conductive metal layer thickness of 10–10000 nm, and preferably the conductive metal layer is a silver, nickel or aluminum layer. The fiber fineness can be varied from 0.05 den (0.055 dtex) microfiber to 100 den (110 dtex) monofilament whereas the yarn fineness can be extended according to the mesh type up to 300 den (33 tex).

In a yet further preferred aspect of the invention, the fiber mesh net consists of a bobbinet woven 3-directional net having 6 to 34 openings per inch and a specific weight of 10 to 50 grams per square meter.

In further aspects of the invention, the fiber mesh consists of warp knitted, woven, Raschel, braided nonwoven or spun multidirectional nets, respectively.

BRIEF DESCRIPTION OF THE DRAWINGS

Other features and advantages of the present invention will become readily apparent for the following description and drawings wherein:

FIG. 8 is a somewhat schematic edge end view of the fiber mesh nets of FIGS. 1, 4 and 6;

FIG. 9 is a somewhat schematic cutaway profile view of a cover structure embodying the insert molded fiber mesh net of the present invention;

FIG. 14 is a somewhat schematic edge end view of the fiber mesh net shown in FIGS. 1, 4 or 6 laminated onto a polymer film;

FIG. 15 is a somewhat schematic profile view showing the fiber mesh net laminated to one surface of a polymer film and electrical circuitry carried on the opposite surface of the polymer film;

FIG. 16 is a somewhat schematic cutaway profile view of a cover structure with the insert molded fiber mesh net embodiment of the invention shown in FIG. 15;

DETAILED DESCRIPTION OF PREFERRED EMBODIMENTS

Figure 1:
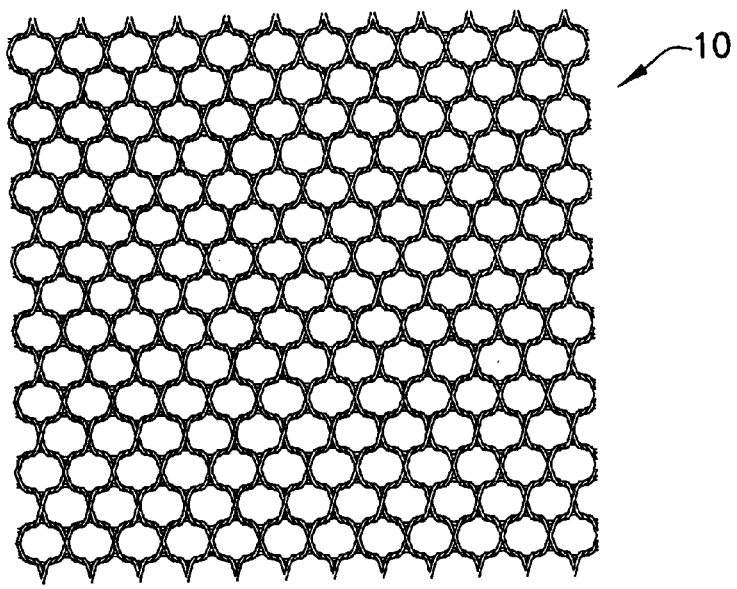
FIG. 1 is a photo reproduction of an example of a fiber mesh net of the type that may be practiced in the present invention.
Figure 2:
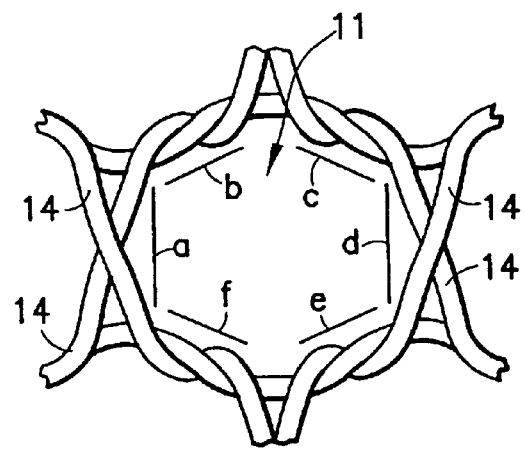
FIG. 2 is a magnified view of woven fibers of the fiber mesh net of FIG. 1.
Figure 3:
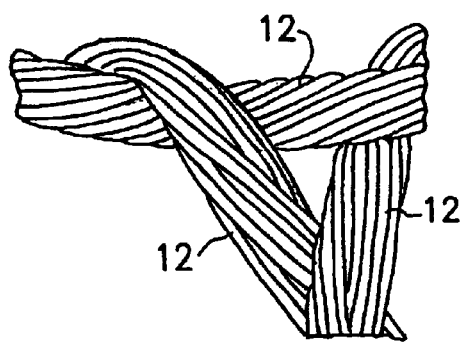
FIG. 3 is a further magnified view of a section of the fiber mesh net shown in FIG. 2 showing the inter-twisting of fibers of the electrically conductive fibers of the fiber mesh net.
Figure 4:
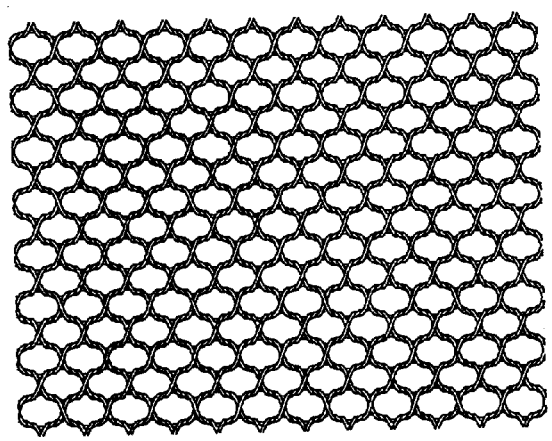
FIG. 4 is a photo reproduction of a further example of a fiber mesh net of the type that may be practiced in the present invention.
Figure 5:
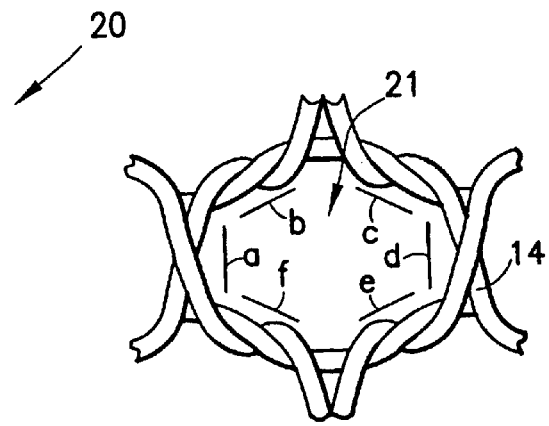
FIG. 5 is a magnified view showing the pattern of woven fibers of the fiber mesh net of FIG. 4.
Figure 6:
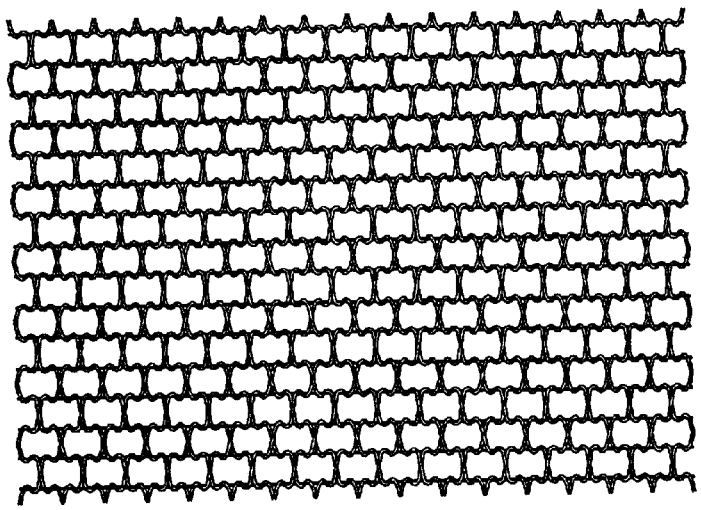
FIG. 6 is a photo reproduction of a yet further example of a fiber mesh net of the type that may be practiced in the present invention.
Figure 7:
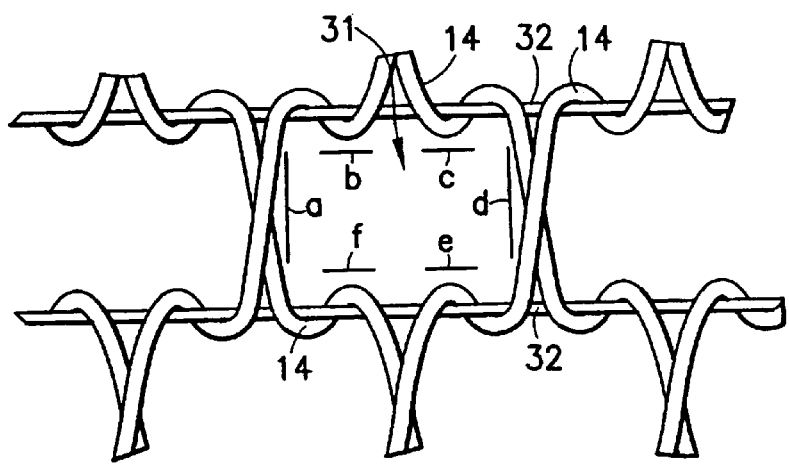
FIG. 7 is a magnified view showing the pattern of woven fibers of the fiber mesh net of FIG. 6.

Turning now to the drawings and referring to FIGS. 1–7, a fiber mesh net of the type contemplated by the present invention is shown therein and designated generally at 10. The fiber mesh net 10 is typically made up of a number of electrically conductive fibers or strands 12, 12 which are intertwisted to form threads 14, 14. The threads 14, 14 are woven or knit in a repetitive pattern to form a sheetlike structure such as the one shown in FIG. 1. A further magnified view of a section of a fiber mesh net of the type which may be practiced with the present invention is shown in FIG. 4 and designated generally at 20. A magnified view of a section of the fiber mesh net 20 is shown in FIG. 5. As can be seen in FIG. 5, the threads 14, 14 are woven in a similar pattern as shown in FIG. 2 for the fiber mesh net 10 shown in FIG. 1. FIG. 6 illustrates a yet further example of a fiber mesh net of the type which may be practiced in the present invention and is designated generally at 30. A magnified view of a section of the fiber mesh net 30 illustrated in FIG. 6 and shown in FIG. 7 shows the pattern of woven threads of the fiber mesh net 30. The fiber mesh net 30 illustrated in FIG. 6 and its corresponding magnified pattern illustrated in FIG. 7 differ from the fiber mesh nets 10, 20 illustrated in FIGS. 1 and 4, respectively in that the threads 14, 14 are not intertwisted with threads 32, 32 but are rather held in position by virtue of the threads 32, 32 and form what is known as a bobbinet woven fiber mesh. The resulting fiber mesh net fabric is called a bobbinet. A bobbinet is defined as a set of hexagonal mesh and as can be seen from the magnified views of FIGS. 2, 5 and 7, the repetitive patterns are six-sided with each side being designated generally a, b, c, d, e, f, respectively as shown therein. Each of the respective patterns define an opening designated generally at 11, 21, 31 in FIGS. 2, 5 and 7, respectively.

In one preferred embodiment, the fiber mesh net is a bobbinet woven 3-directional net having 6 to 34 openings per inch and a specific weight of 10 to 50 grams per square meter. Although the fiber mesh nets 10, 20, 30 are preferably a bobbinet woven fiber mesh net, other textile structures, such as warp knitted, woven, Raschel, braided, nonwoven or spun multidirectional structures providing the desired electrically conductive EMI shielding characteristics are also useable to provide the EMI shielding structure of the present invention. Raschel is characterized by warp knitting with needle bars, latch needles and removal and holding cams as known by those skilled in the art of knitting.

FIG. 8 illustrates a somewhat schematic edge end view of the fiber mesh nets of FIGS. 1, 4 or 6 as showing the terminal ends of the threads 14, 14. Although the threads 14, 14 are shown as multiple intertwisted strands, the threads can be a single strand or fiber.

The shielding effectiveness of the fiber mesh net of the present invention is dependent upon and related to the fiber material and thickness or diameter of the fiber. The fiber material may be natural or synthetic, metal or alloy, conductive or non-conductive, or conductively coated non-conductive material. For example, the fiber mesh may be made of natural fibers or filaments such as cotton and other cellulose fibers, silk or other protein fibers and glass or other ceramic fibers. The fiber mesh may also be made of man-made synthetic, regenerated or metal fibers and filaments, for example, polyesters, polyamides, polypropylenes, polyethylenes and cellulosics such as PES (poly(ethylene terephthalate) and other polyesters from diols and terephthalic and other acids), PA6.6 [poly(hexamethylene adipamide)], PA6 [poly(ε-caprolatam)], PP (polypropylene or polypropene) and copper. Fibers, filaments, and yarns can be coated by a thin conductive metal layer having an approximate thickness of 10 to 10000 nm, and preferably the conductive metal layer a silver, nickel or aluminum layer. The fiber fineness can be varied from 0.05 den (0.055 dtex) microfibers to 100 den (110 dtex) monofilament whereas the yarn fineness can be extended according to the mesh type up to 300 den (33 tex).

The abbreviations used above are defined as follows. Den is an abbreviation for denier which is a unit of fineness or linear density for yarn or fiber equal to the fineness of a yarn or fiber weighing one gram for each 9000 meters. Dtex is an abbreviation for decitex which is a unit of fineness or linear density for yarn or fiber equal to the fineness of a yarn or fiber weighing one gram for each 10,000 meters. Tex is a unit of fineness or linear density for yarn or fiber equal to the fineness of a yarn or fiber weighing one gram for each 1,000 meters.

Test measurements of the fiber mesh net 10 made of a PET-Ag blend resulted in a shielding effectiveness of 39.7 dBm at 1 GHz. Test measurements of the fiber mesh net 20 made of a polyamide PA and silver-coated polyamide (PA-Ag) combination with a weight of 21 grams/meter$^2$ and 0.1 millimeter diameter resulted in a shielding effectiveness of 34.0 dBm at 1 GHz. Test measurements of the fiber mesh net 30 made of a PA and (PA-Ag) combination with a weight of 17 grams/meter$^2$ and 0.6 millimeter diameter resulted in a shielding effectiveness of 31.1 dBm at 1 GHz.

Now referring to FIGS. 9, 10 and 11, the EMI shielding system of the present invention is further explained with reference to the figures. FIG. 9 shows a somewhat schematic cutaway profile view of a cover structure or housing shell 40 wherein the fiber mesh net designated generally at 42 is shown insert molded into a predefined interior cavity 44 formed by the wall 46 of the cover and internal walls 48, 50 of the inner side or electronic circuitry facing side 52 of the cover 40. The interior cavity 44 is positioned in the cover to enclose the area of the electronic circuitry within the electronic device that is desired to be EMI shielded when the cover is placed on a receiving housing shell or base structure (not shown) of the electronic device. As illustrated in FIG. 9, the fiber mesh net 42 is insert molded coextensive with the inner surfaces 54, 56, 58 of the walls 48, 46 and 50, respectively defining the interior cavity 44. A portion 60, 62 of the peripheral edge ends of the fiber mesh net 42 extend to a lower surface 64, 66 of the walls 48, 50 respectively. The fiber mesh net portions 60, 62 are exposed and define a contact surface for mechanical and electrical contact with a ground plane on an electrical printed circuit board (not shown in FIG. 9) to provide the necessary ground voltage potential for effectuating the necessary EMI shielding. The fiber mesh net 42 is insert molded along with the cover 40 such that the fiber mesh net 40 is integrated with the inner surfaces 54, 56, 58 defining the interior cavity 44.

Figure 10:
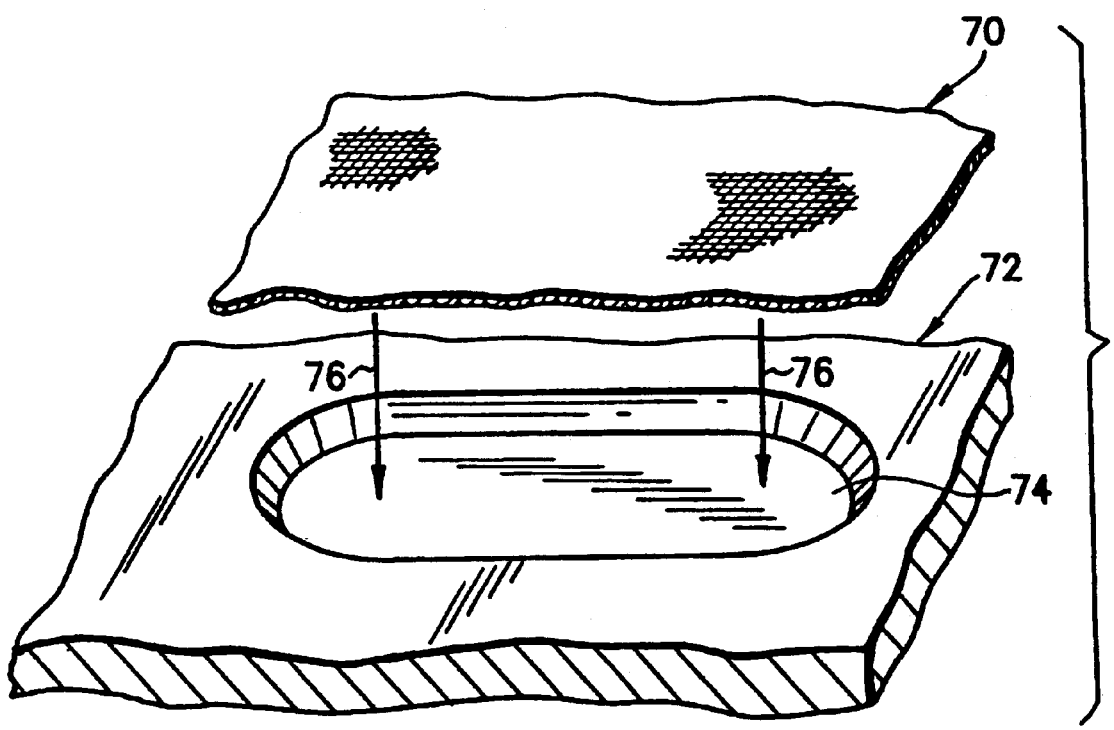
FIG. 10 is a partial view showing one cavity of a multi-cavity mold with a fiber mesh net sheet positioned above the cavity for insert molding with a cover structure.
Figure 11:
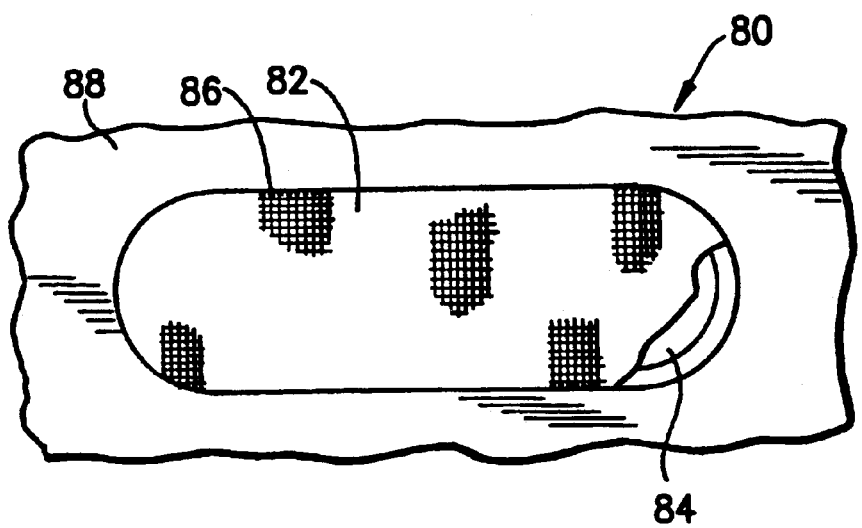
FIG. 11 is a partial view of a cover structure showing the fiber mesh net of the present invention insert molded into the cover structure.

FIG. 10 illustrates conceptually one means for insert molding the fiber mesh net into a cover structure to form the desired EMI shielding solution described in conjunction with FIG. 9. As illustrated in FIG. 10, a fiber mesh net sheet embodying the invention and generally designated at 70 is positioned above the desired location in the cover structure to be molded by means of a mold designated generally at 72. The mold structure 72 is typically a multi-cavity mold and as illustrated, the particular cavity 74 corresponds to the interior cavity in the cover structure with which the fiber mesh net of the present invention will be insert molded to provide the desired EMI shielding. During the molding process of the cover structure, the fiber mesh net sheet 70 is insert molded in the direction illustrated by the arrows 76, 76 into the mold cavity 74 and fuses with the material of the cover structure along the inner surfaces of the cover cavity. The resulting cover structure is illustrated in FIG. 11 and designated generally at 80. The insert molded fiber mesh net designated generally at 82 is shown in the interior cavity 84 of the cover structure 80. A portion of the fiber mesh net 82 defining a peripheral edge 86 of the insert molded fiber mesh net 82 is coextensive with and exposed along the surface 88 immediately adjacent to the cavity 84. Although the fiber mesh net surface is illustrated as being exposed or partially exposed within the interior cavity 84, the fiber mesh net 82 can be totally covered by and within the material forming the cover structure 80. The depth that the fiber mesh net 82 is inserted into the mold cavity can be controlled as required for the particular designed cover structure.

Figure 12:
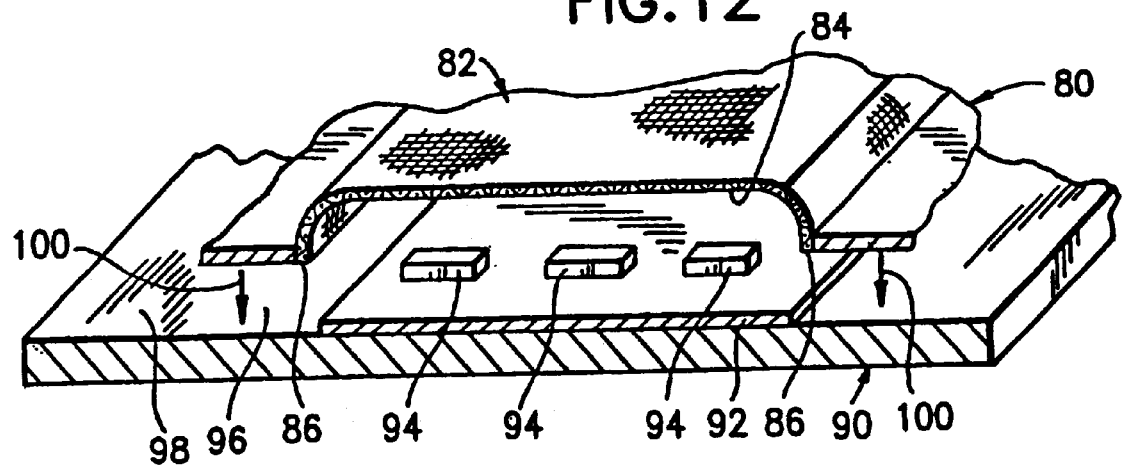
FIG. 12 is a somewhat schematic cutaway profile exploded view of an insert molded fiber mesh net cover structure co-acting with a case to provide EMI shielding.

A somewhat schematic profile cutaway view of the cover structure 80 is illustrated in FIG. 12 to show how the cover 80 co-acts with a receiving housing shell or base structure generally designated at 90 of the electronic device. The housing shell 90 carries a printed circuit board 92 upon which electronic circuitry components 94, 94 are carried and which components 94, 94 are to be EMI shielded. The printed circuit board 92 has a ground plane 96 on the surface 98 facing the cover structure 80. When the cover structure 80 is placed in co-acting relationship with the housing shell 90 as illustrated by the direction arrows 100, 100 the edge portion 86 of the fiber mesh net 82 insert molded in the interior cavity 84 makes mechanical and electrical contact with the ground plane 96 of the circuit board 92 and provides the required EMI shielding.

Figure 13:
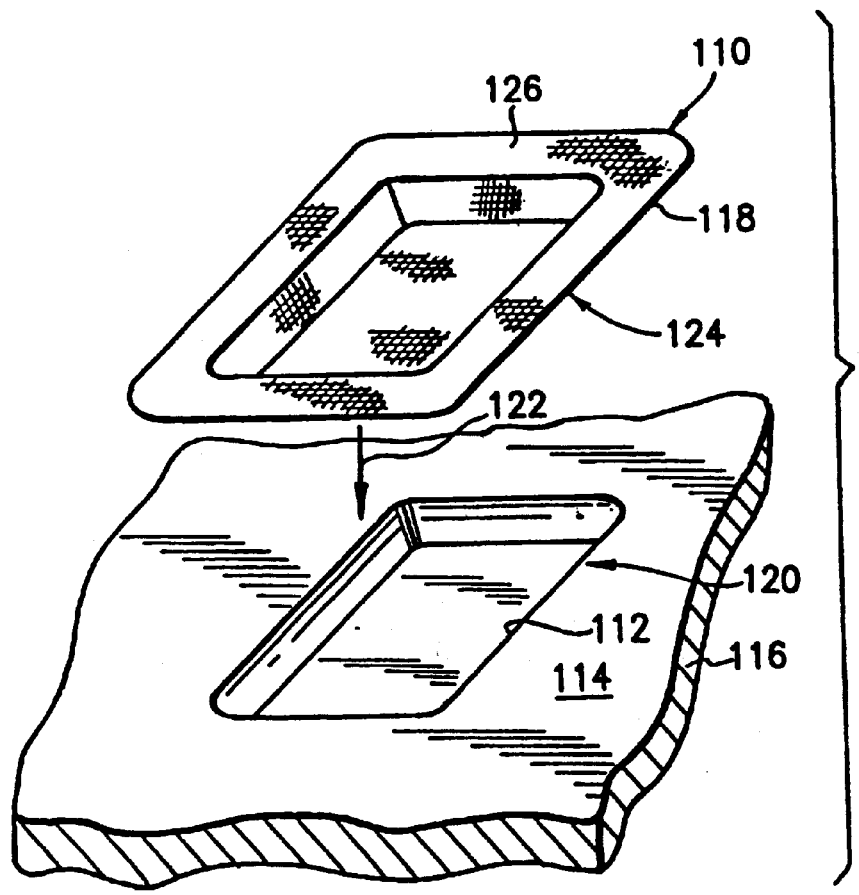
FIG. 13 illustrates a preformed, molded fiber mesh net for insertion into a receiving cavity in a cover structure.

Turning now to FIG. 13, a further embodiment of the present invention is illustrated therein wherein the fiber mesh net EMI shielding structure embodying the present invention is illustrated therein and designated generally at 110. The fiber mesh net 110 is illustrated in this embodiment as a preformed molded piece to conform to the shape, size and contour of a corresponding interior cavity 112 of a cover structure 116 such as for example, the type used to encase a portable electronic device such as a cellular or radio telephone. In the embodiment illustrated in FIG. 13, the fiber mesh net 110 is formed such that it provides an outer peripheral flange or lip 118 having a lower surface 124 which rests on a corresponding peripheral surface region 120 located on the surface 114 surrounding the cavity 112. When the fiber mesh net mold 110 is inserted into the cavity 112 as indicated by the direction arrow 122, the electrically conductive fibers of the fiber mesh net mold 110 along the peripheral surface 126 are positioned in facing relationship with a printed circuit board ground plane (not shown in FIG. 13) similar to the configuration as illustrated in connection with the explanation of FIG. 12. The fiber mesh net mold 110 is maintained within the cavity 112 through surface-to-surface engagement however, preferably through suitable bonding means.

To facilitate ease of handling of the fiber mesh net it may be desirable to join the fiber mesh net shown in FIGS. 1, 4 or 6 with a polymer film layer to form a laminate such as illustrated in a somewhat schematic edge end view in FIG. 14. The polymer film layer designated generally at 130 and the fiber mesh net designated generally at 132 is located on and bonded to the surface 134 of the polymer film layer 130. The laminate generally designated at 136 formed by the polymer film layer 130 and the fiber mesh net 132 is such that at least a portion of the fiber mesh net surface is exposed for mechanical and electrical connection to the ground plane on a printed circuit board as explained above and further to provide flexibility and insert molding into an interior cavity defined in a cover structure as disclosed and described above.

Turning now to FIG. 15, a further embodiment of the EMI shielding structure of the present invention designated generally at 141 is illustrated therein. In FIG. 15, a somewhat schematic profile view shows a fiber mesh net generally designated at 140 laminated to the inner surfaces 142, 144, 146 of the walls 148, 150, 152, respectively defining an interior cavity generally designated at 154. The end portions 156, 158 of the fiber mesh net 140 extend around the lower end surface 160, 162 of the wall 148, 150, respectively. The end portions 156, 158 contact a ground plane or ground circuit path of a printed circuit board (not illustrated in FIG. 15) to provide the necessary electrical ground potential for proper EMI shielding. Electrical circuitry shown schematically at generally designated 164 is carried on a surface 166 opposite the surface 144 upon which surface 144 the fiber mesh net 140 is laminated. The fiber mesh net 140 at the end portion 156 extends across the lower end surface 160 into electrical contact with the circuitry 164 at a connection point generally designated at 168. It should be noted that the electrical circuitry 164 carried on the surface 166 does not extend completely across the polymer film surface 166 to the end portion 158 of the fiber mesh net 140. In the embodiment shown in FIG. 15, the electrical ground potential is carried from the printed circuit board ground plane to the electrical circuitry 164 when the cover is in place as described herein above.

As described herein below, the electrical circuitry can also be used to provide a ground voltage potential connection for additional components located remote from the printed circuit board carried in the housing shell of the electronic device and external to the cover structure. Selected strands of the fiber mesh net 140 are electrically coupled to the electrical circuitry 164 carried by the surface 166 of the polymer layer 143. The EMI shielding structure 141 of FIG. 15 can be pre-shaped or pre-formed to conform to the contours of the cavity into which the EMI shielding structure is insert molded such as the interior cavity in a cover structure as described above.

FIG. 16 shows a somewhat schematic cutaway profile view of a cover structure generally designated at 170 and which cover is similar to the cover structure illustrated in FIG. 9. A polymer film laminated with a fiber mesh net 140 on one surface 144 and electrical circuitry 164 on its opposite surface as described in connection with FIG. 15 is insert molded into a predefined interior cavity 172 formed by the wall 174 of the cover 170 and inner walls 176, 178 on the interior side 180 of the cover 170. The interior cavity 172 is positioned to enclose the area of the electronic circuitry carried on a printed circuit board (not illustrated in FIG. 16) that is desired to be EMI shielded. As illustrated in FIG. 16, the fiber mesh net 140 is coextensive with the inner surfaces 142, 144, 146 of the walls 174, 176, 178, respectively defining the cavity 172. The end portions 156, 158 of the fiber mesh net 140 are left exposed for electrical and mechanical contact with the ground plane on a printed circuit board as explained above in connection with FIG. 12.

Figure 17:
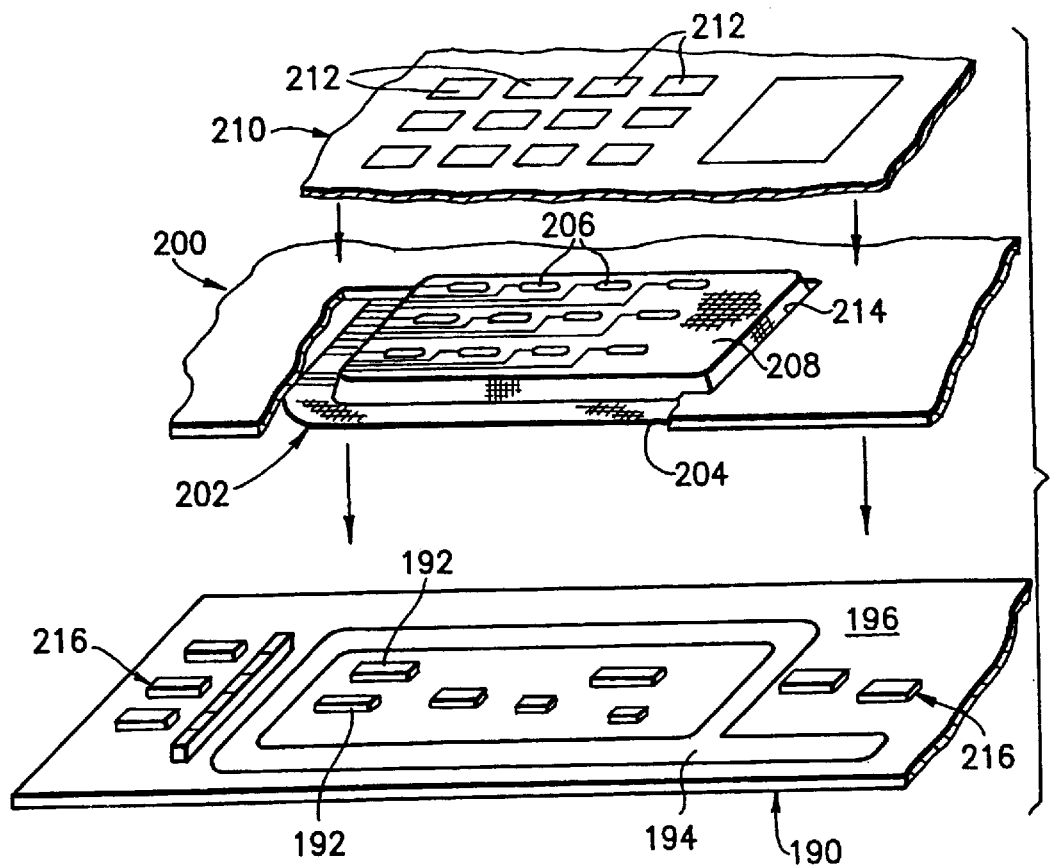
FIG. 17 is a fragmentary, exploded partial view of a portable electronic device wherein a fiber mesh net is laminated on one surface of a polymer film and electronic circuitry is carried on the side opposite to extend circuit functionality to the cover.

Turning now to FIG. 17, a further embodiment of the present invention is illustrated therein as it may be practiced with a portable electronic device such as a cellular or radio telephone. A printed circuit board 190 carrying electronic circuitry including components 192, 192 that generate and emit electromagnetic radiation is supported by and carried within a housing shell of the electronic device (not illustrated in FIG. 17). The ground voltage potential circuit path or ground plane 194 is carried on the surface 196 of the printed circuit board 190. A somewhat schematic fragmentary view of a cover generally designated at 200 in which the fiber mesh net 202 of the present invention is injected molded therein, is shown positioned above the electronic components 192, 192 such that when the cover 200 is placed into position with and attached to the housing shell, the outer peripheral lower edge surface 204 of the fiber mesh net 202 will come into mechanical and electrical contact with the ground plane 194 carried by the printed circuit board surface 196 to provide the necessary electrical ground for the desired EMI shielding.

As further illustrated in FIG. 17, additional electronic circuitry designated generally at 206 is carried on the upward outwardly facing surface 208 and co-acts with an additional laminate overlay generally designated at 210 which may, for example, carry the keys 212, 212 of a dialing pad of the cellular or radio telephone. In the embodiment illustrated in FIG. 17, the additional electronic circuitry 206 carried on the upper surface 208 of the fiber mesh net and polymer film laminate 202 is accessible to the laminate overlay 210 through an appropriately sized and shaped open portion 214 in the cover 200. Although the electronic circuitry 206 carried on the outer surface 208 of the laminate 202 illustrated in FIG. 17 is to provide a ground voltage potential for a keypad laminate overlay 210, additional functional circuitry can be carried on the surface 208 and interconnected with other electronic circuitry 216 carried on the printed circuit board 190 to provide additional functions and/or to provide additional mounting area for the functional electronic circuitry of the cellular or radio telephone. The techniques for applying printed circuit paths and ground planes using conductive inks and interconnection with electrical circuit components are well known to those skilled in the art of producing electronic circuitry on a flexible circuit substrate.

Figure 18:
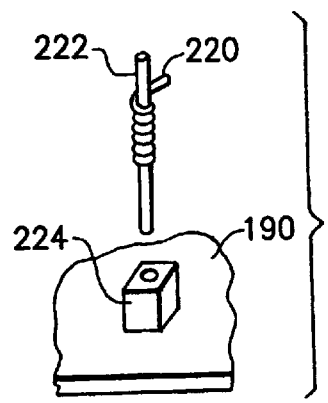
FIG. 18 shows at least one thread of the fiber mesh net wrapped around a conductive post for electrical connection to a printed circuit board.
Figure 19:
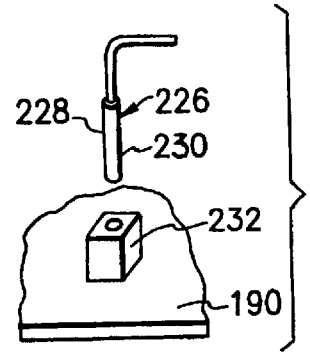
FIG. 19 shows at least one thread of the fiber mesh net attached to a pin for electrical connection to a printed circuit board.

Appropriate and desired electronic signals are carried to and from the printed circuit board circuitry components 216 via specific conductive fibers that are pre-identified and fabricated as part of the fiber mesh net of the present invention. Certain of the threads, for example thread 32, as illustrated in FIG. 7 may carry an insulated outer jacket over an electrical current carrying center conductor through which the electronic signals may pass back and forth from circuitry 216 on the printed circuit board 190 and circuitry 206 on the laminate surface 208. The terminating end of the conductor may be connected to the printed circuit board through various means well known to those skilled in the art for example, as illustrated in FIGS. 18 and 19. FIG. 18 illustrates a wrapping technique wherein the conductor 220 is wound around a stake or post 222 to make electrical and mechanical connection with the post. The post 222 is then inserted into an appropriate mating receiving connector 224 mounted on the printed circuit board 190. FIG. 19 shows a conductor end 226 received into an end 228 of a pin 230 and which pin 230 is in turn inserted into an appropriate mating receiving connector 232 mounted on the printed circuit board 190. Appropriate miniaturization techniques such as ultrasonic welding can be used to increase the density of connection points from and to fibers of the fiber mesh net.

An EMI shielding structure embodying the present invention has been illustrated above in several preferred embodiments. It will be appreciated and understood that numerous modifications may be made by those skilled in the art without departing from the spirit and scope of the invention as presented. Therefore, the present invention has been shown by way of illustration rather than limitation.

We claim:

1. A method for making an EMI shielded portable electronic device, said method characterized by the steps of:
   providing an electrically conductive woven fiber mesh net comprising a given pattern of woven threads of intertwisted electrically conductive fibers defining the fiber mesh net, and insert molding the woven fiber mesh net into the wall surfaces defining an interior cavity in the cover structure of said portable electronic device during the molding process of the cover structure.

2. The method for making an EMI shielded portable electronic device as set forth in claim 1 wherein the step of providing an electrically conductive woven fiber mesh net is further characterized by a bobbinet woven fiber mesh net.

3. The method for making an EMI shielded portable electronic device as set forth in claim 1 wherein the step of providing an electrically conductive woven fiber mesh net is further characterized by providing a textile structure electrically conductive woven fiber mesh net.

4. The method for making an EMI shielded portable electronic device as set forth in claim 1 wherein the step of providing an electrically conductive woven fiber mesh net is further characterized by the step of laminating said woven fiber mesh net to a polymer film sheet.

5. The method for making an EMI shielded portable electronic device as set forth in claim 1 further characterized by said insert molded fiber mesh net interior cavity in the cover structure defining means for containing first electronic circuitry within the portable electronic device.

6. The method for making an EMI shielded portable electronic device as set forth in claim 3 wherein the step of providing the textile electrically conductive woven fiber mesh net includes providing warp knitted, woven, Raschel, braided, non-woven and spun multidirectional textile structures.

7. The method for making an EMI shielded portable electronic device as set forth in claim 4 further characterized in that said polymer film sheet has an electrically non-conductive surface side opposite said electrically conductive woven fiber mesh net surface side for carrying second electronic circuitry, said electrically conductive woven fiber mesh net having at least a portion extending to the non-conductive surface side of said polymer film sheet for mechanical and electrical coupling to said second electronic circuitry.

8. The method for making an EMI shielded portable electronic device as set forth in claim 5 wherein the step of providing an electrically conductive woven fiber mesh net is further characterized by the step of laminating said woven fiber mesh net to a polymer film sheet.

9. The method for making an EMI shielded portable electronic device as set forth in claim 6 further characterized in that said electrically conductive woven fiber mesh net is further characterized by at least a part of said woven fiber mesh net being a mixture of conductive and non-conductive fibers.

10. The method for making an EMI shielded portable electronic device as set forth in claim 7 further characterized in that said electrically conductive woven fiber mesh net is further characterized by at least a part of said woven fiber mesh net being a mixture of conductive and non-conductive fibers.

11. The method for making an EMI shielded portable electronic device as set forth in claim 8 further characterized in that said polymer film sheet has an electrically non-conductive surface side opposite said electrically conductive woven fiber mesh net surface side for carrying second electronic circuitry, said electrically conductive woven fiber mesh net having at least a portion extending to the non-conductive surface side of said polymer film sheet for mechanical and electrical coupling to said second electronic circuitry.

12. The method for making an EMI shielded portable electronic device as set forth in claim 11 further characterized by providing at least a part of said electrically conductive woven fiber mesh net having a mixture of conductive and non-conductive fibers wherein at least one of said conductive fibers carries electrical signals between said first electronic circuitry and said second electronic circuitry.

13. An EMI shielded portable electronic device characterized by:
   wall surfaces defining at least one interior cavity within the cover structure of said electronic device, and
   an electrically conductive woven fiber mesh net comprising a given pattern of woven threads of intertwisted electrically conductive fibers defining the fiber mesh net insert molded into said wall surfaces defining said interior cavity within the cover structure.

14. The EMI shielded portable electronic device as set forth in claim 13 further characterized in that said electrically conductive woven fiber mesh net is a bobbinet woven fiber mesh net.

15. The EMI shielded portable electronic device as set forth in claim 13 further characterized in that said electrically conductive woven fiber mesh net comprises a textile structure mesh net.

16. The EMI shielded portable electronic device as set forth in claim 13 further characterized in that said electrically conductive woven fiber mesh net is preformed to the size, shape and contour of said interior cavity for insert molding into said wall surfaces defining said interior cavity within the cover structure.

17. The EMI shielded portable electronic device as set forth in claim 13 further characterized by a laminate of said electrically conductive woven fiber mesh net and a polymer film sheet.

18. The EMI shielded portable electronic device as set forth in claim 13 further characterized in that said insert molded interior cavity within the cover structure carries first electronic circuitry within said portable electronic device.

19. The EMI shielded portable electronic device as set forth in claim 14 further characterized in that said bobbinet woven fiber mesh net is a bobbinet woven 3-directional fiber mesh net.

20. The EMI shielded portable electronic device as set forth in claim 15 further characterized in that said textile structure fiber mesh net includes all of warp knitted, woven, Raschel, braided, non-woven and spun multidirectional textile structures.

21. The EMI shielded portable electronic device as set forth in claim 17 further characterized in that said polymer film sheet has an electrically non-conductive surface side opposite said fiber mesh net surface side for carrying second electronic circuitry.

22. The EMI shielded portable electronic device as set forth in claim 18 further characterized by a laminate of said electrically conductive woven fiber mesh net and a polymer film sheet.

23. The EMI shielded portable electronic device as set forth in claim 19 wherein said bobbinet woven 3-directional fiber mesh net is further characterized by 6 to 34 openings per inch and a specific weight of 10 to 50 grams per square meter.

24. The EMI shielded portable electronic device set forth in claim 21 further characterized in that at least a part of said electrically conductive woven fiber mesh net is a mixture of conductive and non-conductive fibers.

25. The EMI shielded portable electronic device as set forth in claim 22 further characterized in that said polymer film sheet has an electrically non-conductive surface side opposite said fiber mesh net surface side for carrying second electronic circuitry.

26. The EMI shielded portable electronic device as set forth in claim 25 further characterized in that at least a portion of said electrically conductive woven fiber mesh net is electrically coupled to said second electronic circuitry and to first electronic circuitry within said electrical device for passing electronic signals between said first and said second electronic circuitries.

27. The EMI shielded portable electronic device as set forth in claim 26 wherein said portable electronic device is further characterized by a portion of said cover structure including at least one interior cavity wherein said insert molded electrically conductive woven fiber mesh net is arranged such that said second electronic circuitry is electrically coupled to other electronic circuitry carried on the exterior of said cover structure and for passing electrical signals between said other and said second circuitries.

* * * * *

UNITED STATES PATENT AND TRADEMARK OFFICE
CERTIFICATE OF CORRECTION

PATENT NO.    : 6,738,265 B1  
DATED         : May 18, 2004  
INVENTOR(S)   : Svarfvar et al Page 1 of 1

It is certified that error appears in the above-identified patent and that said Letters Patent is hereby corrected as shown below:

<u>Title page,</u>
Item [56], References Cited, U.S. PATENT DOCUMENTS, please add the following:

| | | | |
|---|---|---|---|
| -- 4,658,958 | 4/1987 | McNulty et al. | 206/328 |
| 4,678,699 | 7/1987 | Kritchersky et al. | 428/175 |
| 4,684,762 | 8/1987 | Gladfelter | 174/36 |
| 4,890,199 | 12/1989 | Beutler | 361/424 |
| 5,804,762 | 9/1998 | Jones et al. | 174/356 |
| 5,895,884 | 4/1999 | Davidson | 174/35 |
| 5,902,956 | 5/1999 | Spies et al. | 174/35 |
| 5,917,710 | 6/1999 | Määttä | 361/818 |
| 5,949,019 | 9/1999 | Sirainen | 174/35 |
| 5,960,332 | 9/1999 | Michalzik | 455/90 -- |

Item [56], References Cited, Foreign Patent Documents, please add the following:
-- EP          0202333      7/1994 --

Signed and Sealed this

Twenty-first Day of December, 2004

JON W. DUDAS  
*Director of the United States Patent and Trademark Office*